US008730745B2

(12) United States Patent
Sasaki

(10) Patent No.: US 8,730,745 B2
(45) Date of Patent: May 20, 2014

(54) SEMICONDUCTOR DEVICE AND METHOD FOR CONTROLLING THE SAME

(75) Inventor: Takahiko Sasaki, Santa Clara, CA (US)

(73) Assignee: Kabushiki Kaisha Toshiba, Tokyo (JP)

(*) Notice: Subject to any disclaimer, the term of this patent is extended or adjusted under 35 U.S.C. 154(b) by 126 days.

(21) Appl. No.: 13/428,256

(22) Filed: Mar. 23, 2012

(65) Prior Publication Data
US 2013/0250649 A1 Sep. 26, 2013

(51) Int. Cl.
*G11C 5/14* (2006.01)

(52) U.S. Cl.
USPC ............... 365/189.09; 365/148; 365/189.011; 365/210.1

(58) Field of Classification Search
CPC .. G11C 13/025; G11C 13/0004; G11C 5/147; G11C 8/08
USPC ................... 365/189.09, 189.011, 210.1, 148
See application file for complete search history.

(56) References Cited

U.S. PATENT DOCUMENTS

| 7,889,537 | B2* | 2/2011 | Edahiro et al. ................. 365/148 |
| 7,898,840 | B2* | 3/2011 | Maejima ........................ 365/148 |
| 7,911,823 | B2* | 3/2011 | Futatsuyama et al. ........ 365/148 |
| 7,969,798 | B2* | 6/2011 | Hwang et al. ............. 365/189.09 |
| 7,978,499 | B2* | 7/2011 | Hosono et al. ................. 365/148 |
| 7,978,539 | B2* | 7/2011 | Lee et al. .................. 365/189.15 |
| 8,149,611 | B2* | 4/2012 | Maejima ........................ 365/148 |
| 8,223,530 | B2* | 7/2012 | Kitagawa ....................... 365/148 |
| 8,271,856 | B2* | 9/2012 | Kang et al. .................... 714/764 |
| 8,355,291 | B2* | 1/2013 | Kim et al. ...................... 365/222 |
| 8,391,052 | B2* | 3/2013 | Kono ............................. 365/148 |
| 8,400,815 | B2* | 3/2013 | Terada et al. ................. 365/148 |
| 8,422,269 | B2* | 4/2013 | Sasaki et al. .................. 365/148 |
| 8,493,800 | B2* | 7/2013 | Terada et al. ............ 365/189.11 |
| 2011/0199838 | A1 | 8/2011 | Terada et al. |
| 2011/0205779 | A1 | 8/2011 | Sasaki |
| 2012/0026778 | A1* | 2/2012 | Maejima ........................ 365/148 |
| 2012/0039110 | A1* | 2/2012 | Maejima et al. .............. 365/148 |

FOREIGN PATENT DOCUMENTS

JP 2010-92568 4/2010

* cited by examiner

*Primary Examiner* — Viet Q Nguyen
(74) *Attorney, Agent, or Firm* — Oblon, Spivak, McClelland, Maier & Neustadt, L.L.P.

(57) ABSTRACT

According to one embodiment, a semiconductor memory device includes a plurality of first interconnects which extend in a first direction and are arranged in a second direction perpendicular to the first direction, a plurality of second interconnects which extend in the second direction and are arranged in the first direction, and a plurality of first storage modules which are formed in regions where the first interconnects and the second interconnects cross. The semiconductor memory device further comprises a first interconnect control module which supplies a voltage to the first interconnects, detects a first current flowing in the first interconnects, and outputs a first voltage corresponding to the first current, a reference voltage generator module which generates a second voltage based on a second current, and a regulator which generates a third voltage based on the first voltage and the second voltage.

14 Claims, 9 Drawing Sheets

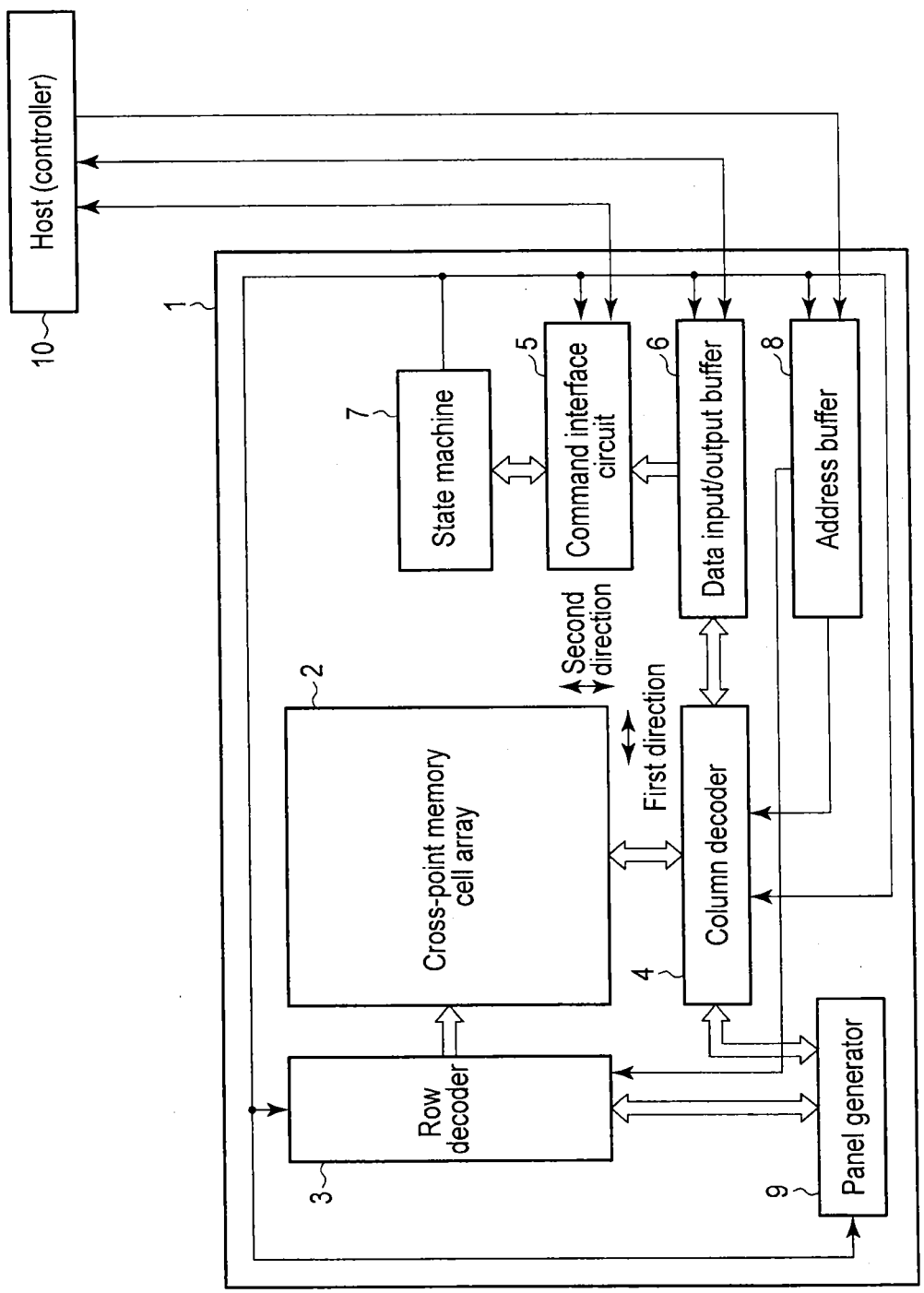
F I G. 1

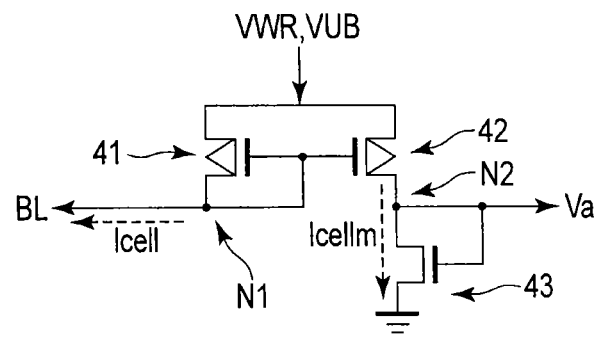
F I G. 5
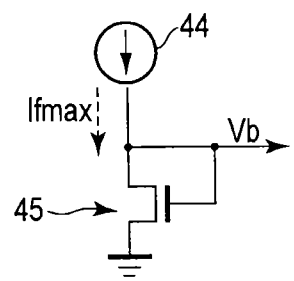
F I G. 6
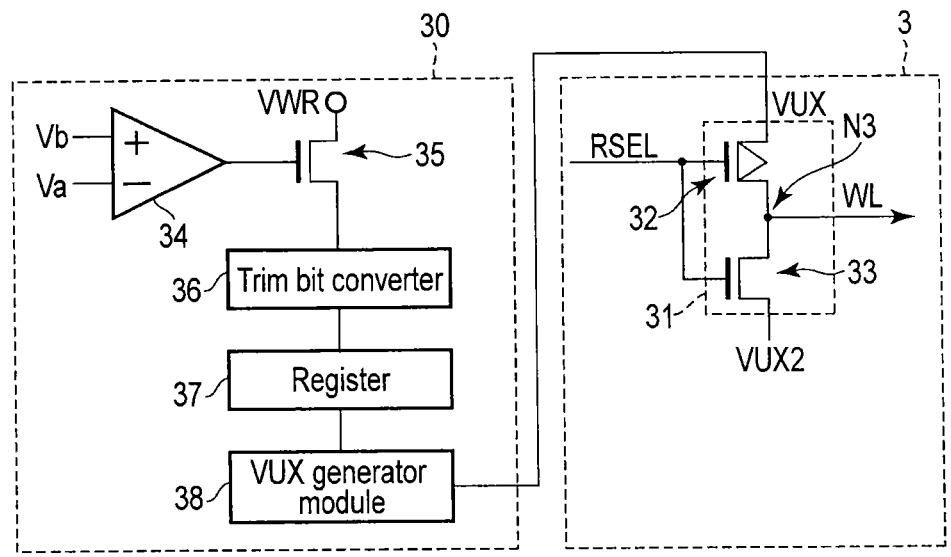
F I G. 7

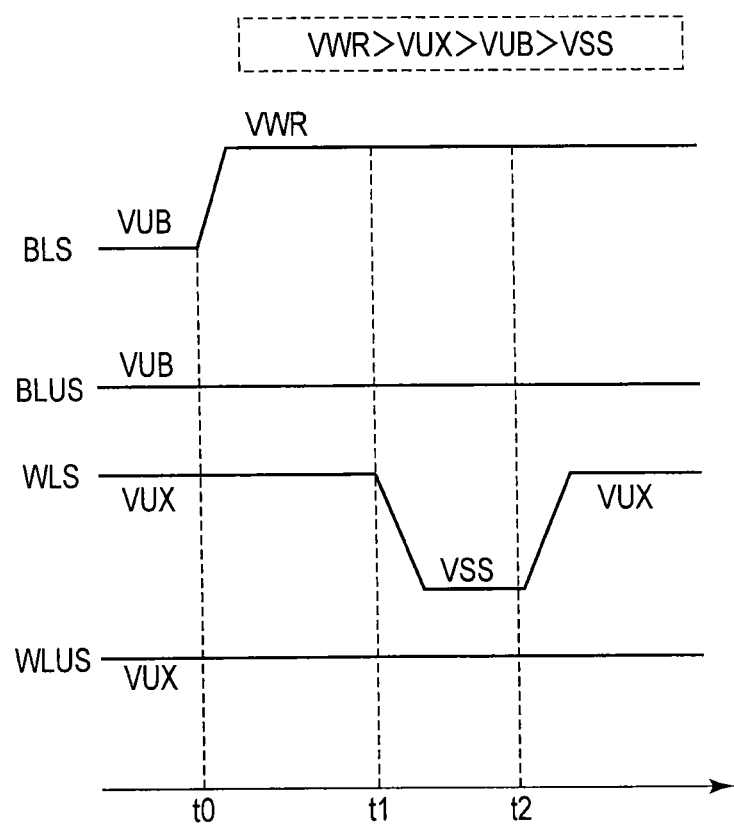
F I G. 8

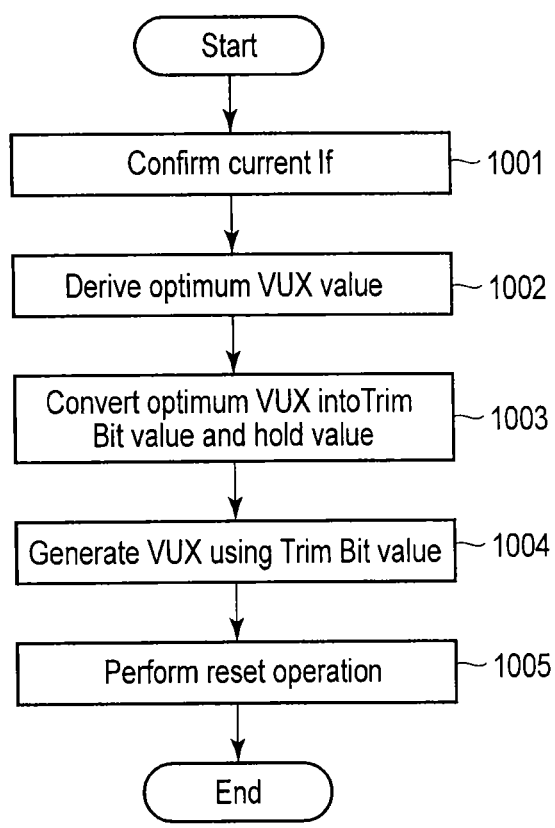
F I G. 11

SEMICONDUCTOR DEVICE AND METHOD FOR CONTROLLING THE SAME

FIELD

Embodiments described herein relate generally to semiconductor memory device and a method of controlling the same.

BACKGROUND

In recent years, resistance-change memories, including a resistive RAM (ReRAM) that uses a variable resistance element as a memory element and a phase-change RAM (PCRAM) that uses a phase-change element as a memory element, have been under development as next-generation nonvolatile semiconductor memories.

One of the resistance-change memories is assumed to be a cross-point memory configured to have cell structures formed at the intersections of a plurality of interconnects arranged in parallel and a plurality of other interconnects intersecting three-dimensionally with the interconnects arranged in parallel.

In the cells of the cross-point memory, selection elements that prevent stray current from flowing in unselected cells adjacent to the selected cell need to be connected in series with memory elements.

BRIEF DESCRIPTION OF THE DRAWINGS

FIG. 1 is a block diagram schematically showing the basic configuration of a semiconductor device according to an embodiment;

FIG. 5 is a circuit diagram schematically showing the basic configuration of a part of a column decoder according to the embodiment;

FIG. 6 is a circuit diagram schematically showing the configuration of a reference voltage generator circuit according to the embodiment;

FIG. 7 is a circuit diagram schematically showing a VUX regulator according to the embodiment;

FIG. 8 is a timing chart for various voltages when a memory cell MC is reset in the embodiment;

FIG. 11 is a flowchart to explain a method of optimizing voltage VUX according to the embodiment.

DETAILED DESCRIPTION

Figure 2:
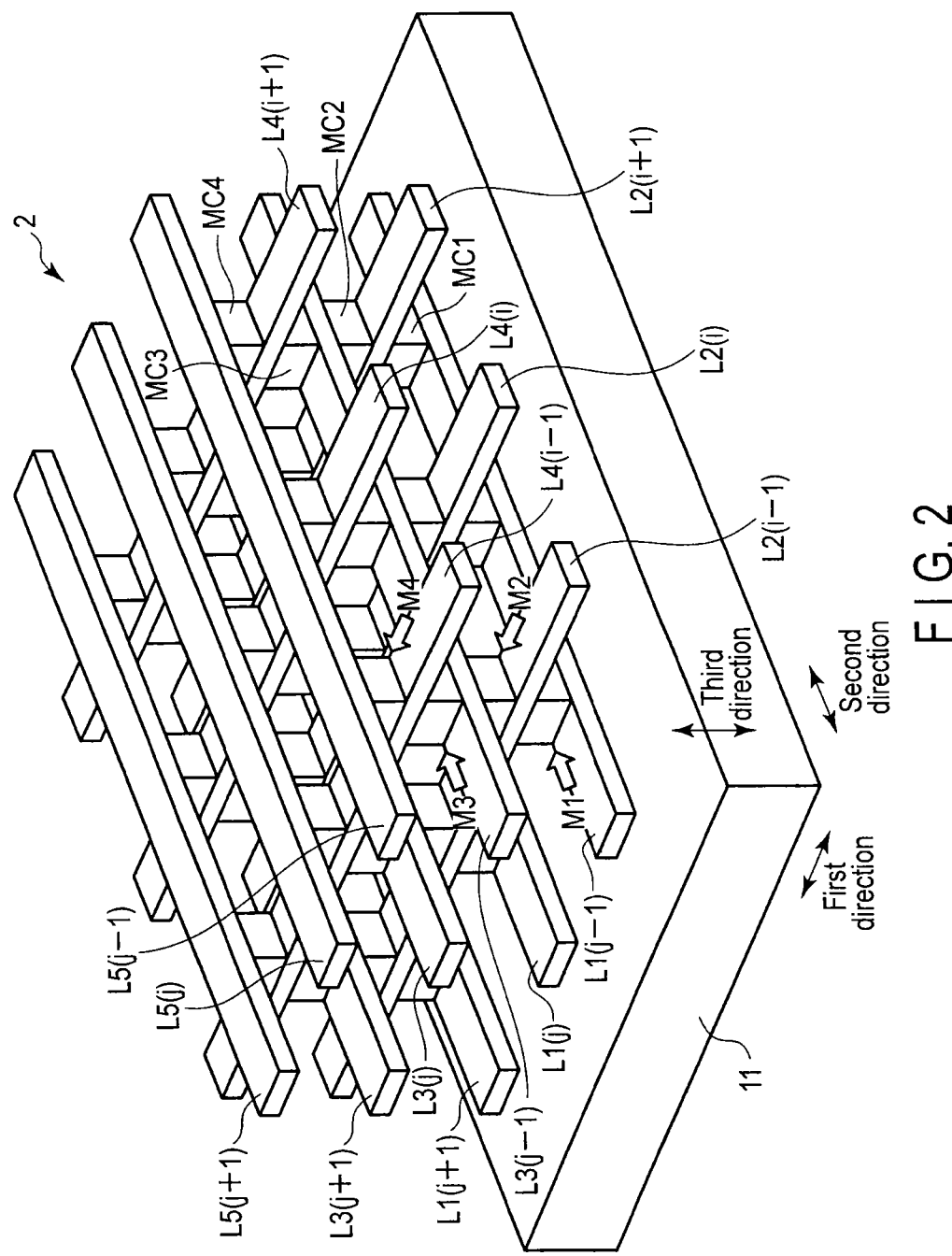
FIG. 2 is a perspective view schematically showing the structure of a cross-point memory cell array according to the embodiment.

In general, according to one embodiment, a semiconductor memory device comprises a plurality of first interconnects (bit lines BLs) which extend in a first direction and are arranged in a second direction perpendicular to the first direction, a plurality of second interconnects (word lines WLs) which extend in the second direction and are arranged in the first direction, and a plurality of first storage modules MCs which are formed in regions where the first interconnects BLs and the second interconnects WLs cross. The semiconductor memory device further comprises a first interconnect control module 4 which supplies a voltage to the first interconnects, detects a first current If flowing in the first interconnects BLs, and outputs a first voltage Va corresponding to the first current If, a reference voltage generator module (44, 45) which generates a second voltage Vb based on a second current Ifmax, and a regulator 30 which generates a third voltage VUX based on the first voltage Va and the second voltage Vb.

Each embodiment described below relates to a resistance-change memory, such as a ReRAM that uses a variable resistance element as a memory element or a PCRAM that uses a phase-change element as a memory element.

Hereinafter, an embodiment configured based on the above knowledge will be explained with reference to the accompanying drawings. In the explanation below, structural elements that have almost the same functions and configurations will be indicated by the same reference numerals or symbols and repeated explanations will be given only when needed. Each embodiment described below will illustrate an apparatus or method for materializing technical ideas of the embodiment. In the technical ideas of the embodiment, the material, shape, structure, layout, and others are not limited to those described below. The technical ideas of the embodiment can be modified variously within the scope of claims.

(First Embodiment)
<1.1 Configuration>
<1.1.1 Configuration of Semiconductor Memory Device>

The basic configuration of a semiconductor memory device according to a first embodiment will be explained with reference to FIG. 1.

As shown in FIG. 1, a semiconductor memory device 1 comprises a memory cell array 2, a row decoder 3, a column decoder 4, a data input/output buffer 6, a command interface circuit 5, a state machine 7, an address buffer 8, and a pulse generator 9.

The memory cell array 2 is of the cross-point type. The cross-point type means a structure that has cell structures formed at the intersections of a plurality of interconnects arranged in parallel and a plurality of other interconnects intersecting three-dimensionally with the interconnects arranged in parallel.

At one end of a first direction of the memory cell array 2, the row decoder 3 is arranged. At one end of a second direction perpendicular to the first direction, the column decoder 4 is arranged.

The row decoder 3 selects a row of the cross-point memory cell array 2 on the basis of, for example, a row address signal. The column decoder 4 selects a column of the cross-point memory cell array 2 on the basis of, for example, a column address signal.

The command interface 5 receives a control signal from an external device (also referred to as a host or a controller) 10. The data input/output buffer 6 receives data from the controller 10.

The command interface 5 determines based on a control signal whether data from the controller 10 is command data. If the data is command data, the command data is transferred from the data input/output buffer 6 to the state machine 7.

The state machine 7 manages the operation of the resistance-change memory on the basis of command data. For example, the state machine 7 manages a set/reset operation and a read operation on the basis of command data from the controller 10. In addition, even when an optimum VUX is generated as described later, the state machine 7 controls the row decoder 3, column decoder 4, a VUX regulator 30 (not shown), and others, taking the initiative in performing a VUX optimizing operation.

The address buffer 8 receives an address signal from the controller 10 in a set/reset operation and a read operation. The address signal includes, for example, a memory cell array selection signal, a row address signal, and a column address signal. The address signal is input to the row decoder 3 and column decoder 4 via the address buffer 8.

Under the control of the state machine 7, the pulse generator 9 outputs, for example, a voltage pulse or a current pulse necessary for a set/reset operation and a read operation with specific timing.

The controller 10 can receive status information managed by the state machine 7 and determine the operation result of a resistance-change memory.

The controller 10 may be arranged in the semiconductor memory device 1 or in an external computer of the semiconductor memory device 1.

<1.1.2 Configuration of Cross-point Memory Cell Array>

The basic configuration of the memory cell array according to the first embodiment will be explained with reference to FIG. 2.

As shown in FIG. 2, the cross-point memory cell array 2 is arranged on a semiconductor substrate (e.g., a silicon substrate) 11. Between the cross-point memory cell array 2 and semiconductor substrate 11, circuit elements, such as MOS transistors, and an insulating film may be sandwiched.

As an example, the cross-point memory cell array 2 is composed of four memory cell arrays M1, M2, M3, M4 stacked in a third direction (or a direction perpendicular to the principal plane of the semiconductor substrate 11) as shown in FIG. 2. However, the number of memory cell arrays stacked is not limited to this.

Memory cell array M1 is composed of a plurality of memory cells MC1s arranged in a first and a second direction in array form.

Similarly, memory cell array M2 is composed of a plurality of memory cells MC2s arranged in an array. Memory cell array M3 is composed of a plurality of memory cells MC3s arranged in an array. Memory cell array M4 is composed of a plurality of memory cells MC4s arranged in an array.

Each of memory cells MC1, MC2, MC3, MC4 is composed of a memory element and a rectifying element connected in series.

On the semiconductor substrate 11, conductive lines L1($j$−1), L1($j$), L1($j$+1), conductive lines L2($i$−1), L2($i$), L2($i$+1), conductive lines L3($j$−1), L3($j$), L3($j$+1), conductive lines L4($i$−1), L4($i$), L4($i$+1), conductive lines L5($j$−1), L5($j$), L5($j$+1) are arranged in that order, starting from the semiconductor substrate 11 side.

The odd-numbered conductive lines from the semiconductor substrate 11 side, that is, conductive lines L1($j$−1), L1($j$), L1($j$+1), conductive lines L3($j$−1), L3($j$), L3($j$+1), conductive lines L5($j$−1), L5($j$), L5($j$+1), extend in the second direction.

The even-numbered conductive lines from the semiconductor substrate 11 side, that is, conductive lines L2($i$−1), L2($i$), L2($i$+1), conductive lines L4($i$−1), L4($i$), L4($i$+1), extend in the first direction.

These conductive lines function as word lines or bit lines.

A first memory cell array M1 at the bottom is arranged between first conductive lines L1($j$−1), L1($j$), L1($j$+1) and second conductive lines L2($i$−1), L2($i$), L2($i$+1). In a set/reset operation and a read operation performed on memory cell array M1, either conductive lines L1($j$−1), L1($j$), L1($j$+1) or conductive lines L2($i$−1), L2($i$), L2($i$+1) are caused to function as word lines and the rest are caused to function as bit lines.

Memory cell array M2 is arranged between second conductive lines L2($i$−1), L2($i$), L2($i$+1) and third conductive lines L3($j$−1), L3($j$), L3($j$+1). In a set/reset operation and a read operation performed on memory cell array M2, either conductive lines L2($i$−1), L1($i$), L1($i$+1) or conductive lines L3($j$−1), L3($j$), L3($j$+1) are caused to function as word lines and the rest are caused to function as bit lines.

Memory cell array M3 is arranged between third conductive lines L3($j$−1), L3($j$), L3($j$+1) and fourth conductive lines L4($i$−1), L4($i$), L4($i$+1). In a set/reset operation and a read operation performed on memory cell array M3, either conductive lines L3($j$−1), L3($j$), L3($j$+1) or conductive lines L4($i$−1), L4($i$), L4($i$+1) are caused to function as word lines and the rest are caused to function as bit lines.

Memory cell array M4 is arranged between fourth conductive lines L4($i$−1), L4($i$), L4($i$+1) and fifth conductive lines L5($j$−1), L5($j$), L5($j$+1). In a set/reset operation and a read operation performed on memory cell array M4, either conductive lines L4($i$−1), L4($i$), L4($i$+1) or conductive lines L5($j$−1), L5($j$), L5($j$+1) are caused to function as word lines and the rest are caused to function as bit lines.

In the first embodiment, conductive lines L1, L3 are used as bit lines BLs and conductive lines L2, L4 are used as word lines WLs.

<1.1.3 Configuration of Memory Cell Array>

The basic configuration of a memory cell array according to the first embodiment will be explained with reference to FIG. 3.

Figure 3:
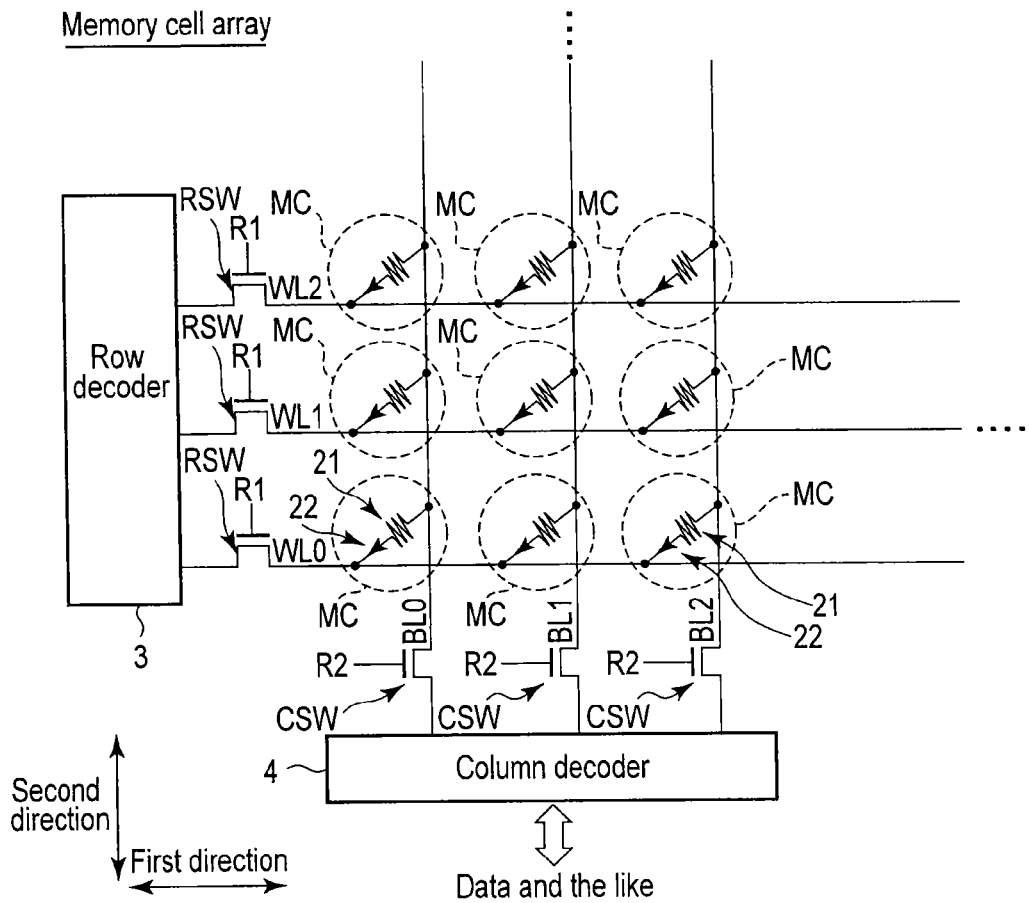
FIG. 3 is a circuit diagram showing a layout of a first and a second control circuit according to the embodiment.

FIG. 3 shows a layout of a first and a second control circuit.

A memory cell array corresponding to any one of memory cell arrays M1, M2, M3, M4 includes (m+1)×(n+1) mats (not shown) arranged in a matrix. Here, each of m and n is a natural number not less than 1. Each of the mats includes a plurality of memory cells MCs arranged in a matrix. For example, a mat includes, for example, 16 word lines WLs and 16 bit lines BLs. That is, a mat includes (16×16) memory cells. A memory cell array includes 16×(m+1) bit lines BLs and 16×(n+1) word lines WLs. Mats that have word lines WLs in common constitute blocks BLK0 to BLKn as units. When there is no need to distinguish between blocks BLK0 to BLKn, they will be simply referred to as blocks BLKs.

Each of the memory cells MCs is composed of a variable resistance element (a resistance-change element) 21 and a diode (a rectifying element) 22. One end of the current path of the variable resistance element 21 is connected to the corresponding one of bit lines BL0, BL1, BL2, ..., BL(16m+15) (m being an integer not less than 1). The other end of the current path is connected to the cathode of a diode 22. The anode of the diode 22 is connected to the corresponding one of word lines WL0, WL1, WL2, ..., WL(16n+15) (n being an integer not less than 1).

The row decoder 3 is connected electrically via switch elements RSW to word lines WL0, WL1, WL2, ..., WL(16n+15) at their one end in the first direction. A switch circuit RSW is composed of, for example, an n-type field-effect transistor (FET) controlled by a control signal R1.

The column decoder 4 is connected electrically via switch elements CSW to bit lines BL0, BL1, BL2, ..., BL(16m+15) at their one end in the second direction. A switch circuit CSW is composed of, for example, an n-type FET controlled by a control signal R2.

The row decoder 3 and column decoder 4 can write/erase/read data into/from/from not only one of the stacked memory cell arrays but also two or more or all of the stacked memory cell arrays simultaneously.

Hereinafter, when there is no need to distinguish between word lines WL0, WL1, WL2, . . . , WL(16n+15), they will be simply referred to as word lines WLs. In addition, when there is no need to distinguish between bit lines BL0, BL1, BL2, . . . , BL(16m+15), they will be simply referred to as bit lines BLs.

<1.1.4 Configuration of Memory Cell>

Figure 4:
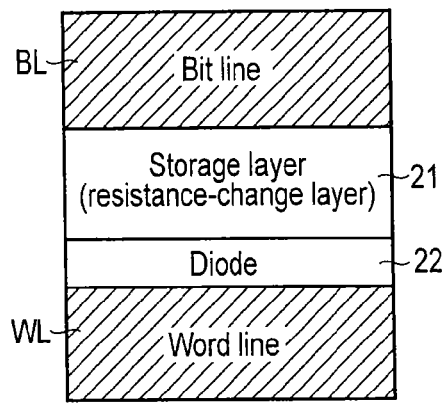
FIG. 4 is a schematic diagram showing the basic configuration of a memory cell MC according to the embodiment.

Next, an example of the configuration of a memory cell MC according to the first embodiment will be explained with reference to FIG. 4. As shown in FIG. 4, a memory cell MC of the first embodiment has a structure where a diode (non-ohmic element) 22 and a variable resistance element 21 functioning as a storage layer (a resistance-change layer) are stacked between a bit line BL and a word line WL. When a specific voltage is applied to the variable resistance element 21, the state of the resistance of the variable resistance element 21 changes. The change of the state of the resistance enables the variable resistance element 21 to store information.

Specifically, a variable resistance element is an element made of a material whose resistance changes with voltage, current, or temperature. A phase-change element is an element made of a material whose solid-state properties, including resistance and capacitance, change due to phase change.

Here, in a variable resistance element, for example, writing is referred to as set and erasing is referred to as reset. It is all right if a resistance value in the set state differs from a resistance value in the reset state.

A method of changing the resistance value of a variable resistance element includes a method of reversibly changing the resistance value of a variable resistance element at least from a first to a second value and vice versa by controlling the magnitude of a voltage and the voltage applied time without changing the polarity of the voltage applied to the variable resistance element and a method of reversibly changing the resistance value of a variable resistance element at least from a first to a second value and vice versa by changing the polarity of the voltage applied to the variable resistance element. The former is known as a unipolar operation and the latter is known as a bipolar operation. The bipolar operation is applied to, for example, a memory that requires bidirectional current in a write operation. The first embodiment can deal with both a unipolar operation and a bipolar operation.

The voltage applied to the variable resistance element may differ between the operation of switching the resistance state of the variable resistance element from a high-resistance state to a low-resistance state and the operation of switching the resistance state from a low-resistance state to a high-resistance state. The voltage used in reading data differs from the voltage used in a set/reset operation (write/erase operation). Specifically, the voltage is high to the extent that the resistance value of the variable resistance element does not change.

<1.1.5 Configuration of a Part of the Column Decoder>

Next, the basic configuration of a part of the column decoder 4 according to the first embodiment will be explained with reference to FIG. 5. FIG. 5 is a circuit diagram schematically showing the basic configuration of a part of the column decoder 4 according to the first embodiment. To clarify a point related to the first embodiment, the description of the configuration related to the other functions, including a data latch configuration, will be omitted.

As shown in FIG. 5, the column decoder 4 includes a p-type MOS transistor 41, a p-type MOS transistor 42, and an n-type MOS transistor 43. To one end of the current path of transistor 41, various voltages, including, for example, voltages VWR, VUB, are applied. The other end of the current path is connected to node N1. The gate of transistor 41 is also connected to node N1. To one end of the current path of transistor 42, various voltages, including, for example, voltages VWR, VUB, are applied. The other end of the current path is connected to node N2. The gate of transistor 42 is connected to node N1. One end of the current path of transistor 43 is connected to node N2. The other end of the current path is connected to the ground potential. The gate of transistor 43 is connected to node N2. Node N1 is connected to a bit line BL. Node N2 is connected to terminal Va of a comparator (operational amplifier) 34 described later.

As described above, transistor 41 and transistor 42 form a current mirror circuit. Transistor 41 supplies cell current icell to the bit line BL and transistor 42 supplies a current corresponding to cell current icell to node N2, causing the gate voltage of transistor 43 to be output as voltage Va.

As shown in FIG. 6, the column decoder 4 includes, for example, an n-type transistor 45 and a current source 44. One end of the current path of the transistor 45 is connected to the current source and further to the gate of the transistor 45. The other end of the current path is grounded. The current source generates reference current Ifmax and causes reference current Ifmax to flow through one end of the current path of the transistor 45. The gate voltage of the transistor 45 is output as voltage Vb. The reference current Ifmax is a current corresponding to the optimum voltage VUX as described later. The reference current Ifmax may be configured to be set, for example, before shipment of the product or to be capable of being changed from outside the semiconductor memory device as needed.

<1.1.6 Configuration of VUX Regulator>

Next, the VUX regulator 30 will be explained with reference to FIG. 7. The VUX regulator 30 includes an operational amplifier 34, a n-type transistor 35, a trim bit converter 36, a register 37, and a VUX generator module 38.

The gate voltage Va of the transistor 43 is input to, for example, an inverting input terminal of the operational amplifier 34 and the gate voltage Vb of the transistor 45 is input to the noninverting input terminal. Voltage VWR is applied to one end of the current path of the transistor 35. The output of the operational amplifier 34 is input to the gate of the transistor 35. The trim bit converter 36, which is connected to the other end of the current path of the transistor 35, converts a voltage supplied from the transistor 35 into a trim bit value (digital value). The register 37, which is connected to the trim bit converter 36, stores a trim bit value created by the trim bit converter 36. The VUX generator module 38 generates a VUX on the basis of the data stored in the register 37.

<1.1.7 Configuration of a Part of the Row Decoder>

As shown in FIG. 7, the row decoder 3 includes a block drive module that applies a voltage to a word line WL. The block drive module 31 includes a p-type transistor 32 and an n-type transistor 33. A VUX from the VUX generator module 38 is applied to one end of the current path of the transistor 32. The other end of the current path of the transistor 32 is connected to node N3. A selection signal RSEL is input to the gate of the transistor 32. Node 3 is connected to one end of the current path of the transistor 33. VUX2 is applied to the other end of the current path of the transistor 33. The selection signal RSEL is input to the gate of the transistor 33. Node N3 is connected to a word line WL.

<1.2 Operation>
<1.2.1 Reset Operation>

Figure 9:
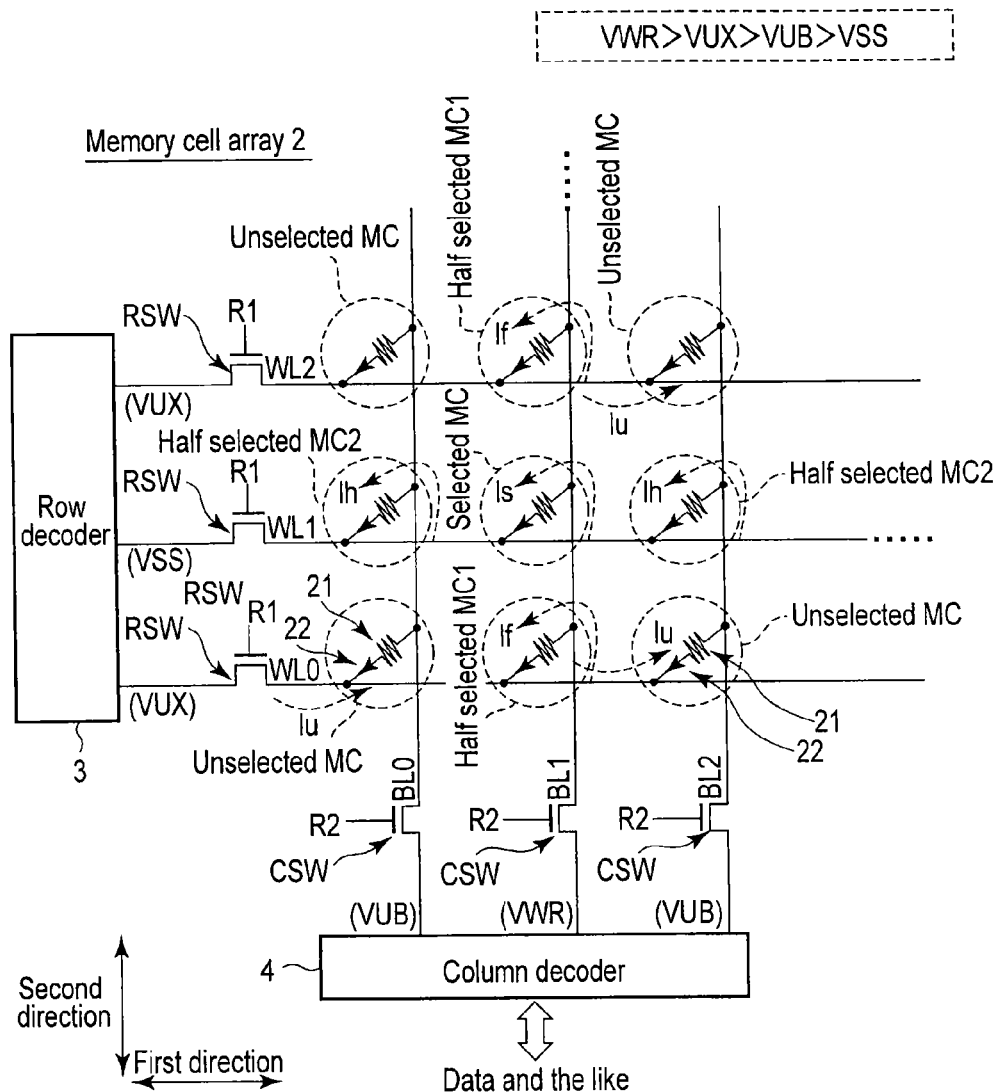
FIG. 9 is a circuit diagram of a memory cell array to be reset.

Next, a case where a memory cell MC connected between word line WL1 and bit line BL1 is reset will be explained with reference to FIGS. 8 and 9. FIG. 8 is a timing chart for various voltages when a memory cell MC is reset in the embodiment. FIG. 9 is a circuit diagram of a memory cell array M to be reset.

As shown in FIG. 8, at time t0, the voltage of bit line BL1 (refer to BLS in FIG. 8) rises from VUB to VWR (VWR>VUB). The voltage of the unselected bit line BL (refer to BLUS in FIG. 8) is fixed at VUB.

At this point time, VUX (VWR>VUX) has been applied to word line WL1 (WLS in FIG. 8) to be reset, word lines WL0, WL2 to WL(16n+15) (WLUS in FIG. 8).

At time t1, VSS is applied to word line WL1. Specifically, in the block drive module 31, since a word line drive module (not shown) transfers voltage VUX2 (VSS) via node N1, voltage VSS is applied to word line WL1. The block drive modules 31 connected to the other word lines WLs apply voltage VUX to word lines WL0, WL2 to WL(16n+15), respectively.

At time t2, to terminate the reset operation, the voltage of word line WL1 is raised to VUX, which completes the reset operation.

Next, a voltage and a current supplied to each memory cell will be explained briefly.

As shown in FIG. 9, when the selected memory cell (Selected MC) is reset, a forward voltage is applied to the selected memory cell, in which current Is is flowing. In addition, a forward voltage is applied to a half-selected memory cell (Half selected MC1) 1, in which cell current If is flowing. Then, a reverse voltage is applied to unselected memory cells (Unselected MCs), in which current Iu is flowing.

Moreover, a forward voltage is applied to a half-selected memory cell (Half selected MC2), in which current Ih is flowing.

Figure 10:
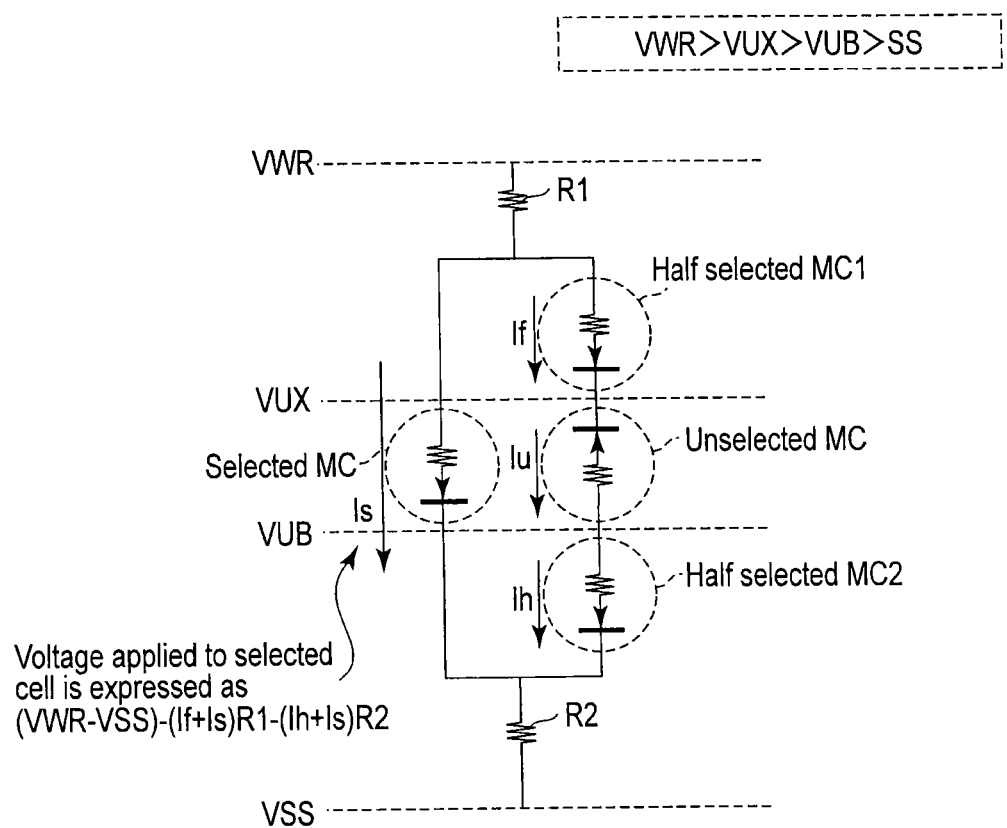
FIG. 10 shows the relationship between a voltage applied to each memory cell and a current in the memory cell.

FIG. 10 shows the relationship between a voltage applied to each memory cell and a current in the memory. In FIG. 10, R1 and R2 represent parasitic resistance values of interconnects.

Current Is is flowing in the selected memory cell (Selected MC). Voltage VSEL applied to the selected memory VSEL is expressed by the following equation:

$$VSEL=\{(VWR-VSS)-(If+Is)R1-(Ih+Is)R2\}$$

In the first embodiment where a memory cell array comprises (16n+15) word lines WLs and (16m+15) bit lines BLs, the number of unselected memory cells is (16n+14)×(16m+14). Therefore, it is seen that the number of unselected memory cells is very large. As a result, current flowing in the unselected memory cells becomes very large. Therefore, it is desirable that current Iu should be made as small as possible. Another problem is that, for example, VUX has not been set properly and therefore when a voltage applied to an unselected memory cell becomes greater than or equal to a specific value, a leakage current will increase. From the aforementioned viewpoint, it is preferable to make VUX as low as possible.

However, when VUX is too low, If increases and therefore VSEL decreases (refer to the above equation), making it impossible to apply a sufficient voltage to the selected memory cell, which might result in poor resetting. Therefore, when VUX is decreased, it is necessary to set VUX to the optimum value.

When a memory cell MC is, for example, reset repeatedly, its temperature rises. As a result, the current flowing in the memory cell MC might change. That is, when the temperature changes, the optimum VUX will also change. Therefore, it is more preferable to optimize voltage VUX in advance each time a reset operation is performed.

<1.2.2 VUX Optimization Operation>

Next, a method of creating the optimum VUX will be explained in detail. FIG. 11 is a flowchart to explain a method of optimizing voltage VUX according to the first embodiment.

[Step S1001]

Figure 12:
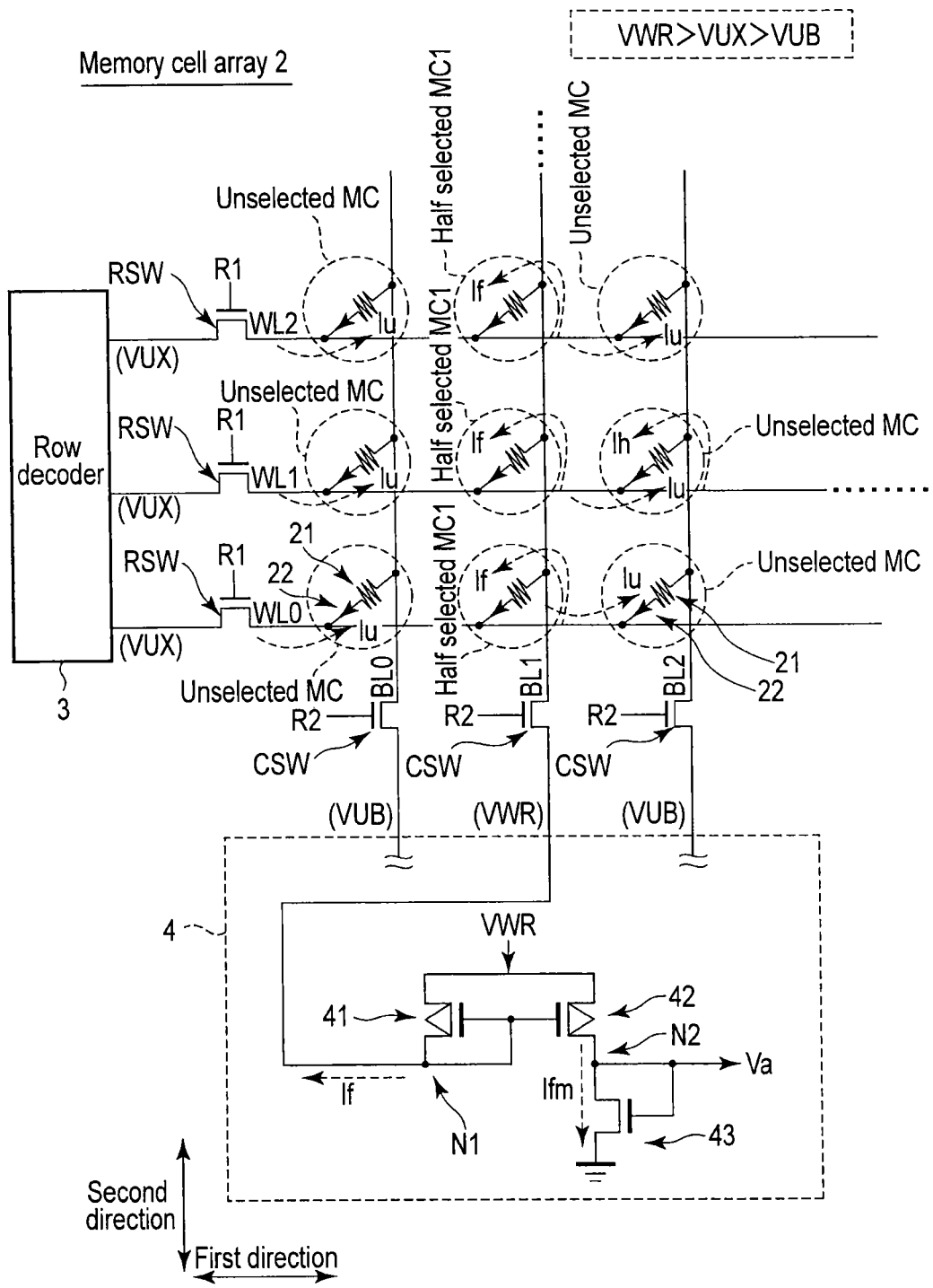
FIG. 12 is a circuit diagram of a memory cell array where current If is to be measured.

For example, the state machine 7 compares current If flowing in half-selected memory cell 1 with allowable current Ifmax before a reset operation of memory cells MCs is started. Specifically, as shown in FIG. 12, the row decoder 3 applies voltage VUX to all the word lines WLs. Then, the column decoder 4 applies voltage VWR to a bit line BL used for comparison of current If and voltage VUB to a bit line not used for detection of current If. As a result, current If flows in the transistor 41 related to a circuit that applies voltage VWR to the bit line BL and a mirror current Ifm corresponding to current If flows in the transistor 42. Then, the transistor 43 receives the mirror current Ifm and applies gate voltage Va to the operational amplifier 34. Then, the operational amplifier 34 compares voltage Va with reference voltage Vb. That is, current Ifm is compared with allowable current Ifmax.

[Step S1002]

Then, the operational amplifier 34 outputs the comparison result to the gate of the transistor 35. As a result, the transistor 35 generates such voltage VUX as makes voltage Va equal to reference voltage Vb, that is, makes current If equal to allowable current Ifmax.

[Step S1003]

The trim bit circuit 36 converts the optimum VUX supplied from the transistor 35 into a trim bit value as VUX voltage information. Then, the register 37 stores the trim bit value.

[Step S1004]

The VUX generator module 38 generates a VUX on the basis of the trim bit value stored in the register 37 when, for example, the output of the VUX is required. The VUX has the same voltage as that of the VUX optimized by the transistor 35.

[Step S1005]

When the trim bit circuit 36 stores data and the optimized VUX can be generated, the semiconductor memory device 1 performs a reset operation on a memory cell to be reset using the optimized VUX.

The above operations may be performed in advance, for example, each time a reset operation is performed. Since the resister 37 stores a trim bit value corresponding to the optimum VUX, the above operations need not be performed in advance each time a reset operation is performed. The timing with which the above operations are performed can be changed as needed. For example, the above operations may be performed only before shipment of the product and the optimum VUX be stored in the register 37.

<1.3 Operational Advantages of the Semiconductor Memory Device of the First Embodiment>

According to the first embodiment, a semiconductor memory device comprises a plurality of first interconnects (bit lines BLs) which extend in a first direction and are arranged in a second direction perpendicular to the first direction, a plurality of second interconnects (word lines WLs) which extend in the second direction and arranged in the first direction, and a plurality of first storage modules MCs formed in regions where the first interconnects BLs and the second interconnects WL cross. The semiconductor memory device further comprises a first interconnect control module 4 which supplies a voltage to the first interconnects, detects a first current If flowing in the first interconnects BLs, and outputs a first voltage Va corresponding to the first current If, a reference voltage generator module (44, 45) which generates a second voltage Vb based on a second current Ifmax, and a regulator 30 which generates a third voltage VUX based on the first voltage Va and the second voltage Vb.

The regulator 30 comprises a computer unit which includes a first input terminal to which the first interconnect control module 4 inputs the first voltage Va, a second input terminal to which the reference voltage generator module inputs the second voltage Vb, and an output terminal that outputs the result of doing calculations based on the first voltage Va and the second voltage Vb. The regulator 30 further comprises a transistor 35 which includes one end of a current path to which a fourth voltage VWR is applied, a gate to which the output of the computing unit 34 is input, and the other end of the current path that outputs a fifth voltage VUX, a converter 36 which creates voltage information based on the fifth voltage supplied from the transistor 35, and a voltage generator module 38 which generates the third voltage VUX based on the voltage information.

With the first embodiment, current If flowing in the half-selected memory cell 1 is compared with the allowable current Ifm of current If to set the VUX so that current If may become allowable Ifmax, thereby generating the optimum VUX.

As explained with reference to FIGS. 9 and 10, the number of unselected memory cells is very large. Therefore, to suppress current flowing in the unselected memory cells, or to suppress an increase in the leakage current, it is preferable to make voltage VUX as low as possible.

However, when VUX is too low, it is impossible to apply a sufficient voltage to the selected memory cell, which might result in poor resetting. Therefore, when the VUX is decreased, it is necessary to set VUX to the optimum value.

In addition, current flowing in a memory cell is influenced by variations in the temperature or power supply, causing the problem of a variation in the optimum VUX.

However, with the first embodiment, allowable current Ifmax corresponding to the optimum VUX is set in advance, current If flowing in a memory cell is compared with allowable current Ifmax as needed, and the VUX is generated so that current If may be equal to allowable current Ifmax, thereby enabling the optimum VUX to be generated. That is, variations in the temperature of a memory cell MC, the power supply, or the like can be dealt with reliably at the time of performing a reset operation. As a result, it is possible to perform a reset operation on the selected memory cell reliably, while suppressing current Iu in the unselected memory cells.

(Modifications)

While in the first embodiment, a reset operation has been explained, this is not necessarily restrictive. The first embodiment may be applied to a set operation or the like.

In addition, reference current Ifmax may be changed from outside the semiconductor memory device as needed. For example, after a suitable VUX has been calculated in a shipment test before shipment of the semiconductor memory device, reference current Ifmax may be determined on the basis of the suitable VUX. The reference current determination operation may be performed using the state machine 7 or the like after shipment of the product.

While in the first embodiment, the regulator 30 comprises the operational amplifier 34 to which a voltage is input from a sense amplifier, the regulator 30 may be configured to cause, for example, a plurality of sense amplifiers to selectively input a voltage to the operational amplifier 34.

In addition, the operational amplifier 34 and transistor 35 are not restrictive. They may be of any type, provided that they can compare current If with reference current Ifmax. For example, the output of the operational amplifier 34 may be made a noninverted output and the transistor 35 may be a p-type transistor.

While in the first embodiment, voltage VUX has been supplied to one end of the current path of the transistor 32, this is not restrictive. Voltage VUX may be supplied, as needed, to a circuit that requires the VUX.

The block drive module 31 is illustrative only and may be modified as needed.

The place where the VUX regulator 30 is arranged is not particularly limited and may be applied anywhere.

While in the first embodiment, an ReRAM has been explained as an example, this is not restrictive. The first embodiment may be applied to a memory that required to set voltages applied to memory cells with high accuracy as needed.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a plurality of first interconnects which extend in a first direction and are arranged in a second direction perpendicular to the first direction;
a plurality of second interconnects which extend in the second direction and are arranged in the first direction;
a plurality of first storage modules which are formed in regions where the first interconnects and the second interconnects cross;
a first interconnect control module which supplies a voltage to the first interconnects, detects a first current flowing in the first interconnects, and outputs a first voltage corresponding to the first current;
a reference voltage generator module which generates a second voltage based on a second current; and
a regulator which generates a third voltage based on the first voltage and the second voltage,
wherein the regulator comprises
a computing unit which includes a first input terminal to which the first interconnect control module inputs the first voltage, a second input terminal to which the reference voltage generator module inputs the second voltage, and an output terminal that outputs a result of doing calculations based on the first voltage and the second voltage,
a transistor which includes one end to a current path to which a fourth voltage is applied, a gate to which the output of the computing unit is input, and the other end of the current path which outputs a fifth voltage,
a converter which creates voltage information based on the fifth voltage supplied from the transistor, and
a voltage generator module which generates the third voltage based on the voltage information.

2. The semiconductor memory device of claim 1, further comprising a second storage module which stores the voltage information created by the converter,
wherein the voltage generator module generates the third voltage based on the voltage information stored in the second storage module.

3. The semiconductor memory device of claim 1, further comprising a second interconnect control module which applies a voltage to the second interconnects,
wherein, before a reset operation or a set operation is performed on one of the first storage modules,
the second interconnect control module applies a sixth voltage to the second interconnects, and
the first interconnect control module applies a seventh voltage higher than the sixth voltage to the first interconnects.

4. The semiconductor memory device of claim 3, wherein, when a reset operation or a set operation is performed on one of the first storage modules,
the second interconnect control module applies an eighth voltage lower than the third voltage to the second interconnect belonging to the first storage module on which a reset operation or a set operation is to be performed, and
applies the third voltage to the second interconnects excluding the one belonging to the first storage module on which a reset operation or a set operation is to be performed, and
the first interconnect control module applies the seventh voltage higher than the third voltage to the first interconnect belonging to the first storage module on which a reset operation or a set operation is to be performed, and
applies a ninth voltage higher than the eighth voltage and lower than the third voltage to the first interconnects excluding the one belonging to the first storage module on which a reset operation or a set operation is to be performed.

5. The semiconductor memory device of claim 1, further comprising a control module which controls the first interconnect control module, the second interconnect control module, and the regulator.

6. The semiconductor memory device of claim 1, wherein the voltage information is a digital value.

7. The semiconductor memory device of claim 1, wherein the first storage module has a structure where a rectifying element and a storage layer are stacked one on top of the other.

8. The semiconductor memory device of claim 7, wherein the storage layer is a resistance-change layer.

9. The semiconductor memory device of claim 1, wherein the third voltage and the fifth voltage are the same.

10. The semiconductor memory device of claim 3, wherein the fourth voltage and the seventh voltage are the same.

11. The semiconductor memory device of claim 1, wherein the second current is variable.

12. A method of controlling a semiconductor memory device which includes a plurality of first interconnects which extend in a first direction and are arranged in a second direction perpendicular to the first direction, a plurality of second interconnects which extend in the second direction and are arranged in the first direction, a plurality of first storage modules which are formed in regions where the first interconnects and the second interconnects cross, a first interconnect control module connected electrically to the first interconnects, a second interconnect control module connected electrically to the second interconnects, a reference voltage generator module which generates a first voltage based on a reference current, and a regulator to which a signal from the first interconnect control module and a signal from the reference voltage generator module are input, the method comprising:
before performing a reset operation or a set operation on one of the first storage modules,
causing the second interconnect control module to apply a second voltage to the second interconnects;
causing the first interconnect control module to apply a third voltage higher than the second voltage to the first interconnects;
causing the first interconnect control module to output a fourth voltage corresponding to a current flowing in the second interconnects;
causing the regulator to do calculations based on the fourth voltage and the first voltage;
causing the regulator to generate a fifth voltage that makes the first voltage and the fourth voltage equal to each other;
causing the regulator to convert the fifth voltage into voltage information; and
causing the regulator to generate a sixth voltage based on the voltage information.

13. The method of claim 12, further comprising:
causing the regulator to store the voltage information, and
causing the regulator to generate the sixth voltage based on the stored voltage information when performing a reset operation or a set operation on one of the first storage modules.

14. The method of claim 12, further comprising:
when performing a reset operation or a set operation on one of the first storage modules,
causing the second interconnect control module to apply a seventh voltage to the second interconnect belonging to the first storage module on which a reset operation or a set operation is to be performed;
causing the second interconnect control module to apply the sixth voltage higher than the seventh voltage to the second interconnects excluding the one belonging to the first storage module on which a reset operation or a set operation is to be performed;
causing the first interconnect control module to apply an eighth voltage higher than the sixth voltage to the first interconnect belonging to the first storage module on which a reset operation or a set operation is to be performed; and
causing the first interconnect control module to apply a ninth voltage higher than the seventh voltage and lower than the sixth voltage to the first interconnects excluding the one belonging to the first storage module on which a reset operation or a set operation is to be performed.

* * * * *